(12) United States Patent
Xiao et al.

(10) Patent No.: US 7,713,755 B1
(45) Date of Patent: May 11, 2010

(54) FIELD ANGLE SENSOR FABRICATED USING REACTIVE ION ETCHING

(75) Inventors: Rongfu Xiao, Fremont, CA (US); Ruth Tong, Los Gatos, CA (US); Witold Kula, Cupertino, CA (US); Chyu-Jiuh Torng, Pleasanton, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 0 days.

(21) Appl. No.: 12/316,501

(22) Filed: Dec. 11, 2008

(51) Int. Cl.
*H01L 21/00* (2006.01)

(52) U.S. Cl. .............. 438/3; 438/74; 438/104; 438/700; 257/E21.218; 257/E21.231; 257/E21.232

(58) Field of Classification Search ......... 438/49, 438/74, 77, 85, 709, 771, 772; 257/E21.233, 257/E21.483; 360/326; 427/599
See application file for complete search history.

(56) References Cited

U.S. PATENT DOCUMENTS

| 6,458,603 | B1 | 10/2002 | Kersch et al. | |
| 6,778,364 | B2* | 8/2004 | Dobisz et al. | 360/324.12 |
| 7,352,531 | B2 | 4/2008 | Kameyama | |
| 2004/0127054 | A1* | 7/2004 | Lee et al. | 438/712 |
| 2006/0002024 | A1 | 1/2006 | Le et al. | |
| 2007/0008762 | A1* | 1/2007 | Lin | 365/58 |

* cited by examiner

*Primary Examiner*—Savitri Mulpuri
*Assistant Examiner*—Cheung Lee
(74) *Attorney, Agent, or Firm*—Saile Ackerman LLC; Stephen B. Ackerman

(57) ABSTRACT

A high-amplitude magnetic angle sensor is described along with a process for its manufacture. A thin tantalum nitride hard mask, used to pattern the device, is left in place within the completed structure but, by first converting most of it to tantalum oxide, its effect on current shunting is greatly reduced.

10 Claims, 2 Drawing Sheets

# FIELD ANGLE SENSOR FABRICATED USING REACTIVE ION ETCHING

FIELD OF THE INVENTION

The invention relates to GMR based magnetic field angle sensors with particular reference to their fabrication using a particular reactive ion etching (RIE) technique.

BACKGROUND OF THE INVENTION

Several magnetic field angle sensor designs have been proposed and used but there remains a need for a monolithic (single chip) low-cost design. This is a subject of the present invention. The disclosed GMR-based element is integrated with the other parts of magnetic field angle sensor for a one-chip solution with single process flow.

A routine search of the prior art was performed with the following references of interest being found:

In U.S. Patent Application 2006/0002024, Le et al. disclose a first RIE of tantalum nitride using CF4/CHF3 and a second RIE chemistry based on $O_2$, $CO_2$, $NH_3/H_2$ or $H_2/N_2$ as examples. U.S. Pat. No. 6,458,603 (Kersch et al) teaches RIE using $CHF_3$, $CF_4$, and Ar with a tantalum nitride/Ta diffusion barrier, while U.S. Pat. No. 7,352,531 (Kameyama) teaches GMR etching using an oxygen plasma and $CF_4$.

SUMMARY OF THE INVENTION

It has been an object of at least one embodiment of the present invention to provide a magnetic angle sensor device having improved sensitivity and accuracy.

Another object of at least one embodiment of the present invention has been to provide a process for manufacturing said magnetic angle sensor.

Still another object of at least one embodiment of the present invention has been to minimize shunting effects by a hard mask of TaN that is used in the process and then left behind as part of the completed structure.

A further object of at least one embodiment of the present invention has been to use exotic etchants as part of said manufacturing process.

These objects have been achieved by first forming a GMR stack in the usual way. The stack is then coated with a layer of TaN whose thickness is very carefully controlled. This is so that when the photoresist used to pattern the TaN (for later use as a hard mask) is stripped in an oxygen plasma, most of the TaN is converted to TaO/TaON so that the hard mask's sheet resistance is increased to be of the order of 2.5M ohm/sq. Since the hard mask is left in place within the completed structure, to avoid damaging the sensor while it is being removed, this high sheet resistance serves to minimize any electric current shunting effects that would reduce the effectiveness of the device.

DESCRIPTION OF THE PREFERRED EMBODIMENTS

Highlights of the invention include:
(1) High-amplitude, low-shunting GMR stack as the angle sensor element
(2) GMR stack integration with a special reactive ion etch
(3) A thin tantalum nitride layer is used as a hard mask
(4) The GMR angle sensor exhibits little electrical shunting by the top tantalum nitride layer.

Figure 1:
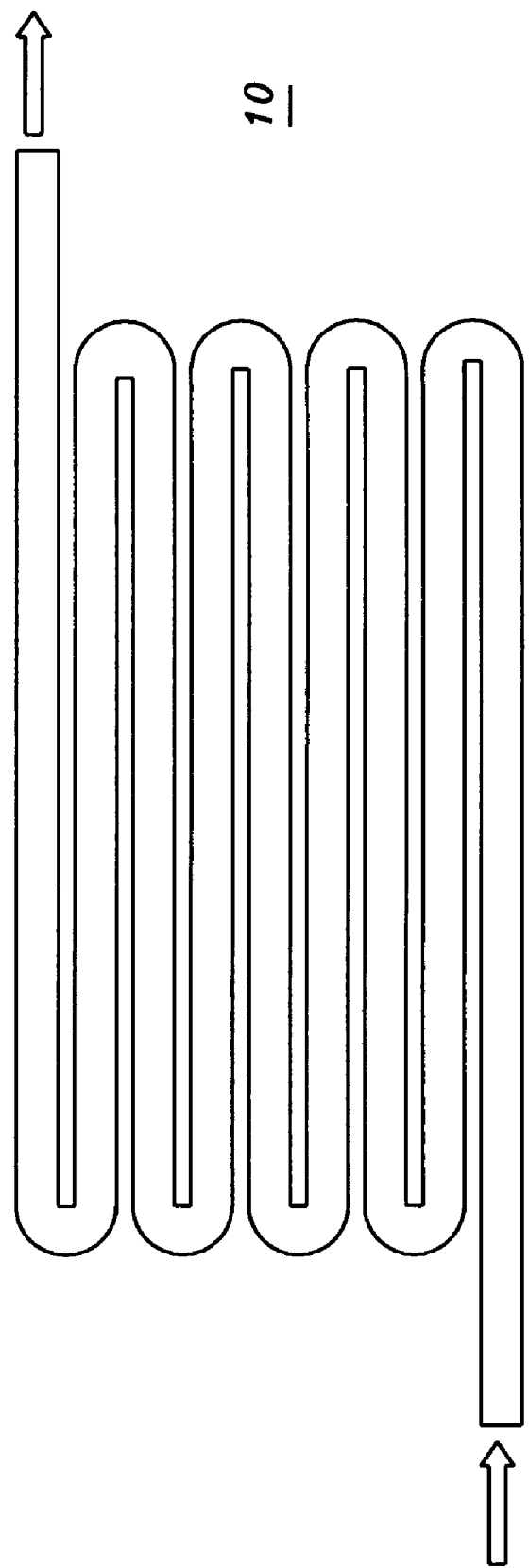
FIG. 1. Plan view of magnetic angle sensing element, illustrating its serpentine shape.

The GMR-based device 10 that comprises the present invention is illustrated in plan view in FIG. 1 which shows how, by using a serpentine shape, the free layer may be given a large aspect ratio while still being confined within an overall area that has a relatively low aspect ratio.

Typically, the dimensions of the coil structure in FIG. 1 are about 190 mm (length of a single turn of the coil)×74 mm, comprising seven turns of the coil, each 10 mm wide. This gives the overall aspect ratio of 190/74=2.6, the unraveled aspect ratio of (7×190)/10=133, and the close-packed density of (10,000×10,000)/(190×74)=7519 coils/cm². This close-packed density refers to the coil only; in practical implementations the coil is only part of the entire sensor (which further includes contact pads and other elements), making the full sensor dimensions to be about 706 mm×560 mm, which reduces the effective close-packed density to about 253 sensors/cm².

Figure 2B:
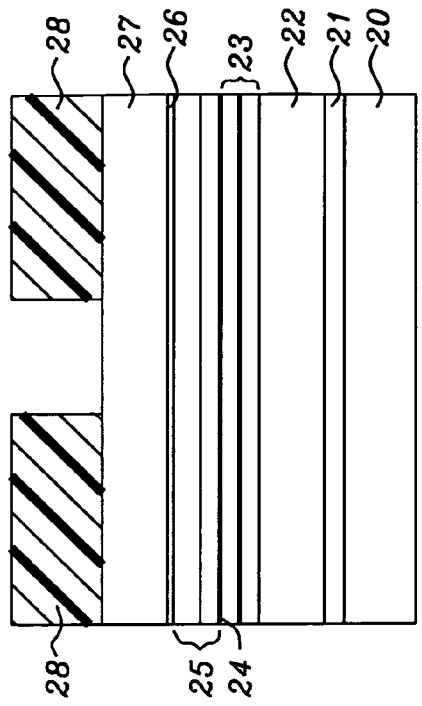
FIG. 2(b) A photoresist pattern is formed for patterning the tantalum nitride hard mask.

To achieve the needed high dR/R signal, the multiple layers that make up the GMR stack are all deposited during a single pump down. Starting with substrate 20, seed layer 21 (generally NiCr), with a thickness between about 40 and 80 Angstroms, is first deposited thereon. Then, the full complement of GMR layers is deposited, as shown in FIG. 2(a). These include: antiferromagnetic (AFM) layer 22 of MnPt (generally about 120 to 200 Angstroms thick), synthetic pinning trilayer 23 (CoFe/Ru/CoFe), Cu-spacer 24, magnetic free layer 25 (typically CoFe/NiFe 5 to 20/10 to 30 Angstroms), Ru capping layer 26 (5 to 30 Angstroms), and 100 to 200 Angstroms of tantalum nitride 27 that will play a critical role as a hard mask.

Tantalum nitride layer 27 is formed by reactive sputtering of a Ta target in the presence of nitrogen. By adjusting the $N_2$ partial pressure during deposition, a tantalum nitride layer having high electrical resistance is formed. Typically, the sputtering gas would comprise argon at a partial pressure in the range of $10^{-4}$ to $10^{-2}$ torr and nitrogen at a partial pressure in the range of $10^{-4}$ to $10^{-2}$ torr for a total puttering pressure of from $2\times10^{-4}$ to $2\times10^{-2}$ torr. Typically, the tantalum nitride layer was deposited at a rate of from 30 to 120 Angstroms/minute using DC magnetron sputtering.

All the deposition steps listed above were performed in a multi-target UHV PVD chamber. Following its formation, the GMR stack was annealed at a temperature of 250° C., or higher, in the presence of a magnetic field of at least 1000 Oe, to establish good magnetic pinning.

After annealing, the angle sensor device itself is formed through use of a reactive ion etch: Photoresist layer 28, including, though not shown, a BARC (bottom anti-reflection coating) is first patterned as shown in FIG. 2(b). The tantalum nitride hard mask layer 27 is etched in a $CF_4$ gas under the following conditions: source/bias power of 500 W/50 W, $CF_4$ flow rate of 50 sccm, in a pressure of 4.5 mtorr for 37 seconds, followed by stripping the photoresist in an oxygen plasma.

Figure 2D:
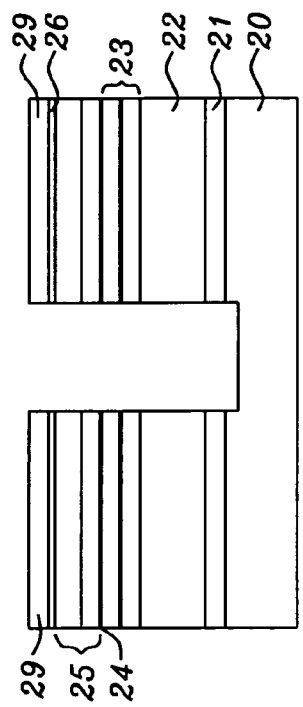
FIG. 2(d) The full GMR stack is etched by CH3OH gas to form the completed sensor.
Figure 2A:
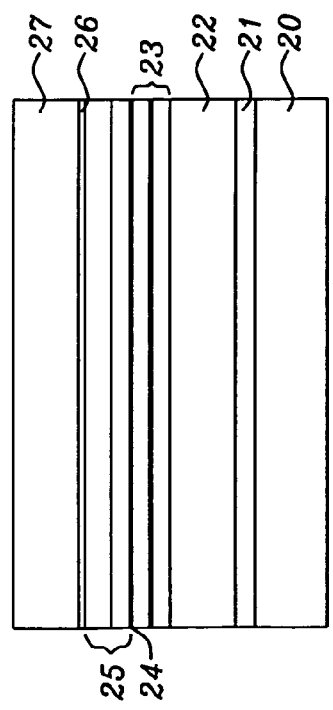
FIG. 2(a) Cross-sectional view of initial structure at start of processing.
Figure 2C:
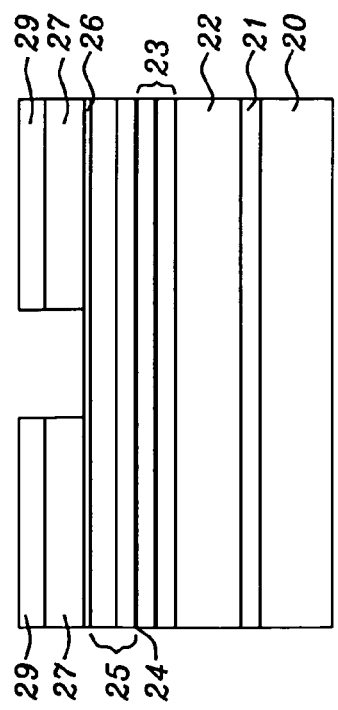
FIG. 2(c) The tantalum nitride hard mask is patterned by CF4 RIE and then partially oxidized.

This results in portion 29 (typically about 50 Angstroms) of the top tantalum nitride layer being oxidized to TaO as shown in FIG. 2(c).

The full assemblage is then transferred to a second etching chamber where the remainder of the GMR stack is etched using TaN as a hard mask in $CH_3OH$ gas under the following conditions: source/bias power of 1500 W/1300 W, $CH_3OH$ flow rate of 15 sccm, at a pressure of 3 mT for 60 seconds. An important feature is that the patterned TaO/tantalum nitride layer serves as a hard mask during this critical step.

It is important to note that the thickness of the original tantalum nitride layer must be very carefully controlled (to within ±5 Angstroms) so as to ensure that only very thin tantalum nitride 29 is left after the completion of GMR etch, as seen in FIG. 2(d). Thus, the final remaining hard mask is layer 27 of partially oxidized tantalum nitride with a thickness of 80 to 120 Angstroms and a sheet resistance of at least 500 ohms per square. When these tolerances are held, optimum device performance is achieved and current shunting is effectively eliminated. This generates the following additional advantages:

(1). The feature line width of GMR sensor can be made very narrow and device cross section profile (i.e. their sidewalls) can be very steep (2). The sensors' areal density can be made very high

What is claimed is:

1. A process to manufacture a magnetic angle sensor, comprising:
   providing a substrate and depositing thereon a seed layer;
   depositing on said seed layer, in unbroken succession, an antiferromagnetic layer, a synthetic magnetic pinned trilayer, a copper spacer layer, a magnetic free layer, and a capping layer, thereby forming a GMR stack;
   depositing on said capping layer, to a thickness whose value ranges from 120 to 200 Angstroms with a precision of ±5 Angstroms, a layer of tantalum nitride;
   then annealing said GMR stack at a temperature of at least 250° C. in the presence of a magnetic field of at least 1000 Oe, thereby establishing good magnetic pinning;
   forming a photoresist mask on said tantalum nitride layer and then selectively patterning only said tantalum nitride layer, through etching in $CF_4$ gas, to become a hard mask having a serpentine shape;
   stripping said photoresist mask in an oxygen plasma whereby between 30 and 60% of said tantalum nitride layer is converted to tantalum oxynitride; and
   then, through use of reactive ion etching, removing all layers of said GMR stack that are not protected by said partially oxidized tantalum nitride hard mask, whereby said magnetic angle sensor is formed.

2. The process recited in claim 1 wherein said layer of tantalum nitride is deposited through reactive sputtering in a gas containing nitrogen having a partial pressure in the range of $10^{-4}$ to $10^{-2}$ torr and a total pressure in the range of $2\times10^{-4}$ to $2\times10^{-2}$ torr.

3. The process recited in claim 1 wherein said layer of tantalum nitride is deposited at a rate of between 30 and 120 Angstroms per minute.

4. The process recited in claim 1 wherein the step of etching said layer of tantalum nitride in $CF_4$ gas further comprises a CF4 gas flow of 50 sccm, with a source/bias power of 500 W/50 W at a pressure of 4.5 mT for about 40 seconds, followed by oxygen plasma stripping ($O_2$ gas flow of 100 sccm, source/bias power of 500 W/300 W at a pressure of 7.5 mT for 60 seconds) of remaining photoresist and Ta redeposit.

5. The process recited in claim 1 wherein the step of removing all layers of said GMR stack that are not protected by said partially oxidized tantalum nitride hard mask, through use of reactive ion etching, further comprises a $CH_3OH$ gas flow of 15 sccm, with a source/bias power of 1500 W/1300 W at a pressure of 3 mT for about 60 seconds.

6. The process recited in claim 1 wherein said partially oxidized tantalum nitride hard mask has a thickness in the range of from 80 to 120 Angstroms.

7. The process recited in claim 1 wherein said partially oxidized tantalum nitride hard mask has a sheet resistance in the range of at least 500 ohms per square.

8. The process recited in claim 1 wherein current shunting, within said magnetic angle sensor by said hard mask, is negligible whereby optimum device performance of said angle sensor is achieved.

9. The process recited in claim 1 wherein space occupied by said hard mask has an aspect ratio in the range of 0.2 to 5.

10. The process recited in claim 1 wherein if said serpentine shape were unraveled to become a single line, said hard mask would have an aspect ratio in the range of 50 to 300.

* * * * *